United States Patent [19]
Yamazaki

[11] Patent Number: 6,113,701
[45] Date of Patent: Sep. 5, 2000

[54] SEMICONDUCTOR DEVICE, MANUFACTURING METHOD, AND SYSTEM

[75] Inventor: Shunpei Yamazaki, Tokyo, Japan

[73] Assignee: Semiconductor Energy Laboratory Co., Ltd., Kanagawa-ken, Japan

[21] Appl. No.: 08/220,492

[22] Filed: Mar. 31, 1994

Related U.S. Application Data

[62] Division of application No. 07/895,229, Jun. 10, 1992, which is a continuation of application No. 07/593,257, Oct. 1, 1990, abandoned, which is a division of application No. 07/118,892, Nov. 10, 1987, abandoned, which is a continuation-in-part of application No. 06/929,449, Nov. 12, 1986, abandoned, which is a continuation-in-part of application No. 06/701,738, Feb. 14, 1985, Pat. No. 4,636,401.

[30] Foreign Application Priority Data

Nov. 12, 1985 [JP] Japan .................................. 60-253299
Nov. 18, 1985 [JP] Japan .................................. 60-259194

[51] Int. Cl.[7] .................................................. C23C 16/00
[52] U.S. Cl. ..................................... 118/719; 118/723 MR
[58] Field of Search ..................... 118/718, 717, 118/723 E, 723 MP, 723 MW, 723 ME, 723 MR, 723 MA, 723 HC; 156/345; 204/298.38, 298.34, 298.35, 298.25, 298.06, 298.11

[56] References Cited

U.S. PATENT DOCUMENTS

| | | | |
|---|---|---|---|
| 3,644,931 | 2/1972 | Gerstenberg | 204/38 A |
| 3,785,853 | 1/1974 | Kirkman | 427/255.3 |
| 3,911,579 | 10/1975 | Lane et al. | 30/346.54 |

(List continued on next page.)

FOREIGN PATENT DOCUMENTS

| | | | |
|---|---|---|---|
| 3144016 | 7/1982 | Germany | 118/723 MR |
| 55-78524 | 6/1980 | Japan . | |
| 0105332 | 7/1980 | Japan | 437/40 |
| 56-155535 | 12/1981 | Japan . | |
| 5739460 | 3/1982 | Japan . | |
| 57-167631 | 9/1982 | Japan . | |
| 57-177975 | 11/1982 | Japan . | |
| 5893321 | 6/1983 | Japan . | |
| 0196063 | 10/1983 | Japan | 118/719 |

(List continued on next page.)

OTHER PUBLICATIONS

Bunshah, *Deposition Technologies for Films and Coatings*, Noyes Publications, Park Ridge N.J.,©1982, p. 376.

"Reactive Bean Ion Etching Using A Broad Beam ECR Ion Source", S. Matsuo and Y. Adachi, Japanese Journal of Applied Physica vol. 21 No. 1, Jan., 1982, pp. L4–L6.

"High Conductive Wide Band Gap P–Type a–S:C:H Prepared by ECR CVD and Its Application to High Efficiency a–S: Basis Solar Cells", Y. Hattori et al. pp. 1–6, Presented at IEEE PVSC (New Orleans) May 4–8, 1987.

Dylla "Turbomolecular Pump Vacuum System for the Princeton Large Torus", J. Vac. Sci. & Tech, vol. 15, No. 2, pp. 734–740, 1978.

Outlaw, "Ultrahigh Vacuum Produced by a Combination of Turbomolecular and Titanium Sublimation Pumping", J. Vac. Sci. & Tech., vol. 3, No. 6, pp. 352–354, 1966.

Weil et al., "Glow–Discharge a–SiiF Prepared from SiF$_2$ Gas", Journal de Physique, Oct. 1981, pp. 643–646.

Maissel et al., Handbook of Thin Film Technology, McGraw–Hill Book Company, pp. 2–4 to 2–9.

English Translation of Japanese Patent Laid–Open 60–194060, published: Oct. 2, 1985; Inventor: Hideo Shibata.

C.C. Tsai et al., Journal of Non–Crystalline Solids, vol. 59 & 60, Dec. 1983, Part II, pp. 649–1326.

*Primary Examiner*—Joni Y. Chang
*Attorney, Agent, or Firm*—Sixbey, Friedman, Leedom & Ferguson, P.C.; Eric J. Robinson

[57] ABSTRACT

An improved semiconductor device manufacturing system and method is shown. In the system, undesirable sputtering effect can be averted by virtue of a combination of an ECR system and a CVD system. Prior to the deposition according to the above combination, a sub-layer can be pre-formed on a substrate in a reaction chamber and transported to another chamber in which deposition is made according to the combination without making contact with air, so that a junction thus formed has good characteristics.

5 Claims, 3 Drawing Sheets

U.S. PATENT DOCUMENTS

| | | | |
|---|---|---|---|
| 4,141,811 | 2/1979 | Yerkes | 204/192 E |
| 4,171,235 | 10/1979 | Fraas et al. | 118/719 |
| 4,226,208 | 10/1980 | Nishida | 118/706 |
| 4,262,631 | 4/1981 | Kuback | 118/723 |
| 4,264,393 | 4/1981 | Gorin et al. | 156/345 |
| 4,274,936 | 6/1981 | Love | 204/192 R |
| 4,282,267 | 8/1981 | Kuyel | 427/38 |
| 4,317,844 | 3/1982 | Carlson | 427/39 |
| 4,363,828 | 12/1982 | Brodsky | 427/39 |
| 4,399,014 | 8/1983 | Engle | 204/192 E |
| 4,401,054 | 8/1983 | Matsuo | 118/723 |
| 4,401,507 | 8/1983 | Engle | 156/643 |
| 4,421,592 | 12/1983 | Shuskus | 156/613 |
| 4,435,445 | 3/1984 | Allred et al. | 427/54.1 |
| 4,438,188 | 3/1984 | Shimatani et al. | 430/128 |
| 4,438,723 | 3/1984 | Cannella et al. | 118/719 X |
| 4,461,783 | 7/1984 | Yamazaki | 427/39 |
| 4,464,415 | 8/1984 | Yamazaki | 427/39 |
| 4,481,229 | 11/1984 | Suzuki | 427/38 |
| 4,485,125 | 11/1984 | Izu et al. | 427/39 X |
| 4,492,716 | 1/1985 | Yamazaki | 427/38 |
| 4,515,107 | 5/1985 | Fournier et al. | 118/718 |
| 4,522,663 | 6/1985 | Ovshinsky | 427/39 |
| 4,532,199 | 7/1985 | Ueno | 427/39 |
| 4,534,816 | 8/1985 | Chen et al. | 156/345 |
| 4,537,795 | 8/1985 | Nath | 427/38 |
| 4,544,423 | 10/1985 | Tsuge et al. | 427/39 |
| 4,579,609 | 4/1986 | Reif et al. | 427/39 X |
| 4,582,720 | 4/1986 | Yamazaki | 427/38 |
| 4,592,306 | 6/1986 | Gallego | 118/723 |
| 4,608,063 | 8/1986 | Kurokawa | 118/50.1 X |
| 4,613,400 | 9/1986 | Tam | 156/643 |
| 4,615,298 | 10/1986 | Yamazaki | 118/723 |
| 4,624,736 | 11/1986 | Gee | 118/728 |
| 4,636,401 | 1/1987 | Yamazaki | 118/723 |
| 4,664,769 | 5/1987 | Cuomo | 204/192.1 |
| 4,798,166 | 1/1989 | Hirooka | 118/719 |
| 4,800,174 | 1/1989 | Ishihara et al. | 118/723 |
| 4,808,553 | 2/1989 | Yamazaki | 118/723 |
| 4,808,554 | 2/1989 | Yamazaki | 118/719 |
| 4,825,808 | 5/1989 | Takahashi | 118/719 |
| 4,951,601 | 8/1990 | Maydan | 118/719 |
| 5,000,113 | 3/1991 | Wang et al. | 118/723 |

FOREIGN PATENT DOCUMENTS

| | | | |
|---|---|---|---|
| 216625 | 1/1984 | Japan . | |
| 59-100516 | 6/1984 | Japan . | |
| 59-208791 | 11/1984 | Japan . | |
| 59-220918 | 12/1984 | Japan . | |
| 60-089919 | 5/1985 | Japan . | |
| 60-138909 | 7/1985 | Japan . | |
| 60-167318 | 8/1985 | Japan | 118/719 |
| 60-170234 | 8/1985 | Japan . | |
| 60-224215 | 11/1985 | Japan | 118/719 |
| 60-224216 | 11/1985 | Japan | 118/719 |
| 61-32511 | 2/1986 | Japan | 118/719 |
| 61-199626 | 9/1986 | Japan | 118/719 |
| 62-89874 | 4/1987 | Japan | 118/723 |
| 62-89875 | 4/1987 | Japan | 118/723 MP |
| 62-89876 | 4/1987 | Japan | 118/723 MP |
| 62-112318 | 5/1987 | Japan | 118/723 |
| 62-118520 | 5/1987 | Japan | 118/723 |
| 2119406 | 11/1983 | United Kingdom | 118/719 |

SEMICONDUCTOR DEVICE, MANUFACTURING METHOD, AND SYSTEM

This is a divisional application of Ser. No. 07/895,229, filed Jun. 10, 1992, which itself was a continuation of Ser. No. 07/593,257, filed Oct. 1, 1990, now abandoned, which itself was a division of Ser. No. 07/118,892, filed Nov. 10, 1987, (now abandoned) which was a continuation-in-part of Ser. No. 06/929,449, filed Nov. 12, 1986 (now abandoned), which itself was a continuation-in-part of Ser. No. 06/701,738, filed Feb. 14, 1985 (now U.S. Pat. No. 4,636,401).

BACKGROUND OF THE INVENTION

This invention relates to a semiconductor device manufacturing method and system, and more particularly, to a semiconductor manufacturing process with a multi-chamber system.

There has been known a plasma CVD system in which reactant gas is activated by glow discharge alone. The known process is considered advantageous compared with conventional thermal CVD systems in that a deposition process can be carried out at a relatively low temperature. Further, the deposited layer thus formed contains hydrogen or halogen as a recombination neutralizer, which can impart an improved p-n, n-i or p-i junction to the layer.

Such a glow discharge CVD system, however, has only a very low deposition speed which is required to be increased by a factor of 10 to 500 for commercial applicability.

On the other hand, a CVD system enhanced by ECR is also known in which a deposition process is carried out at a pressure lower than $1\times10^{-2}$ torr, e.g., $1\times10^{-2}$ to $1\times10^{-5}$ torr. According to this method and system, a 5000 A to 10 microns thick layer can be deposited at a rate of 10 to 100 A/sec. However, when a plurality of layers are desired to be deposited, it requires a substantially longer time.

SUMMARY OF THE INVENTION

It is therefore an object of the invention to provide a semiconductor manufacturing method and system capable of producing a semiconductor device with a high quality junction.

It is therefore another object of the invention to provide a semiconductor manufacturing method and system capable of yielding large throughput.

It is therefore a further object of the invention to provide a semiconductor manufacturing method and system with a short processing time.

DETAILED DESCRIPTION OF THE PREFERRED EMBODIMENT

According to the invention, nonreactive gas such as argon gas is energized by electron cyclotron resonance. The active nonreactive gas can transfer a part of its energy to a reactive gas which is decomposed in a glow discharge CVD system, so that an intrinsic layer can be deposited without a sputtering effect on a sub-layer (an impurity doped semiconductor layer) which has been already formed on a substrate. Namely, the tendency of the glow discharge CVD method to injure a substrate by its sputtering effect is largely alleviated.

Depositions are carried out in a multi-chamber system in which a plurality of depositions are made in succession without the substrate making contact with air. As a result, junctions are prevented from contamination and from incurring lower oxide or lower nitride formation.

Further, combination of an ECR system and a glow discharge CVD system makes it possible to perform depositions at high speed and with the product having high quality.

The deposition is made at low pressures, e.g. $10^{-5}$ to $10^{-2}$, preferably $10^{-4}$ to $10^{-3}$ torr, which are very low in comparison with the pressures used in the prior art, e.g. about 0.1 to 0.5 torr. The low pressure reduces the residual gas retained in the chamber which contaminates the next deposition process, making it possible to streamline manufacturing processes including a plurality of deposition processes by dispensing with conventional steps of evacuating the chambers sufficiently and then opening a valve partitioning the chambers before the actual deposition step.

As a reactant gas, a silicide gas such as $Si_nH_{2n+1}$ ($n\geq 1$), $SiF_n$ ($n\geq 2$), $SiH_nF_{4-n}$ ($1<n<4$) or $Si(CH_3)_nH_{4-n}$ ($n=1,2,3$), a germanium composition such as $GeH_4$, $GeF_4$ or $GeH_nF_{4-n}$ ($n=1,2,3$), or a tin compound such as $SnCl_4$, $SnF_2$ or $SnF_4$ can be employed.

In addition to this, a doping gas may be added as an additive such as $B_2H_6$, $BF_3$ or $PH_3$ to fabricate an impurity doped semiconductor layer.

Figure 1:
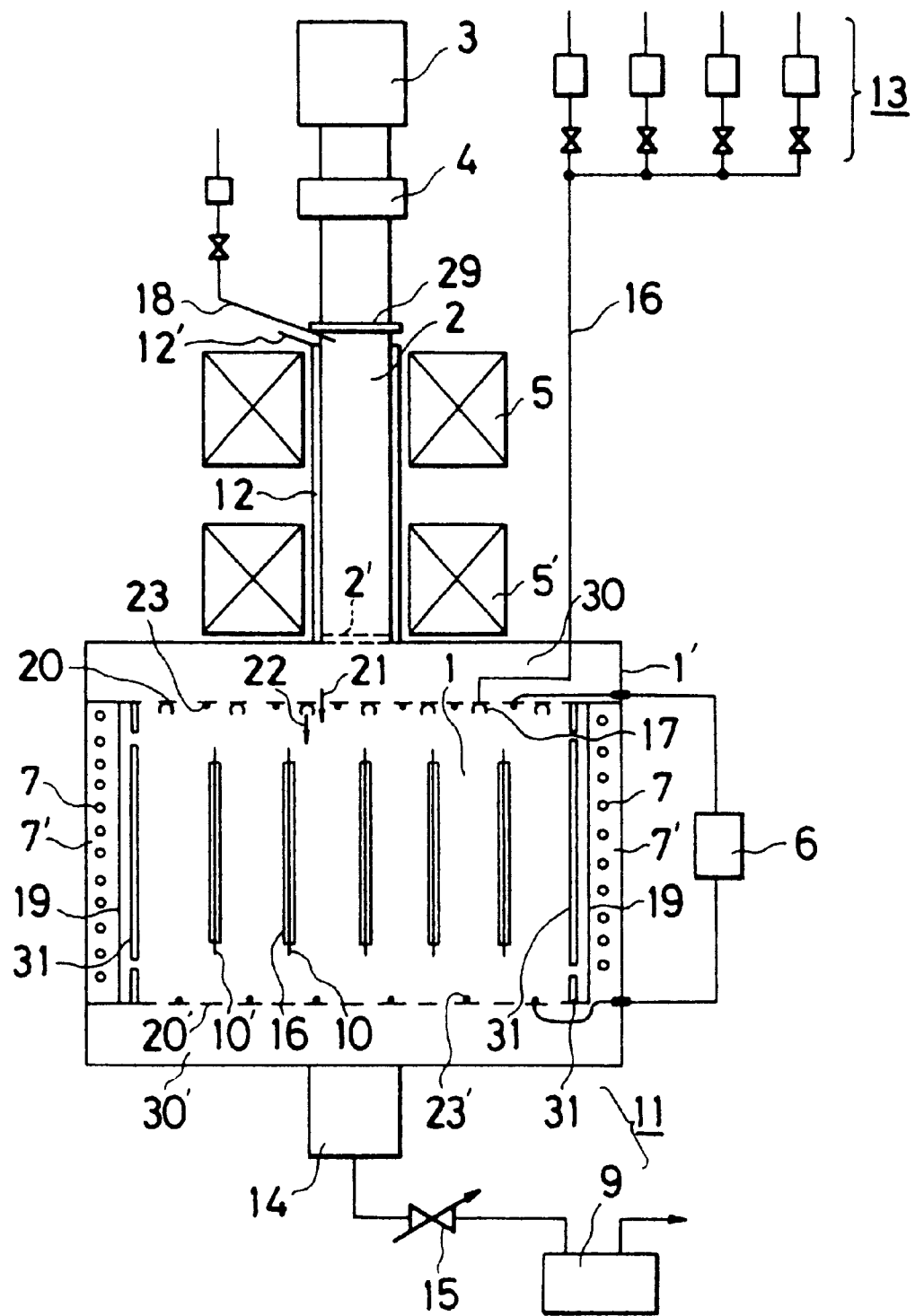
FIG. 1 is a cross-sectional view of an ECR enhanced CVD system.

Referring now to FIG. 1, a plasma enhanced CVD system employed in a system according to the invention is shown. A reaction chamber 1 is accompanied, although not shown in the figure, with a loading chamber and an unloading chamber on the opposite sides of the reaction chamber 1, perpendicular to the plane of the paper. The reaction chamber and the loading and unloading chambers communicate with each other through gate valves. Between the loading and unloading chambers, a reaction space is surrounded by collars 31 and 31' made of stainless steel and/or an insulator so that excited reactant gas does not spread out to the inside of the structure and does not accumulate the product which can cause flakes to be present in a thus deposited layer. The collar 31 is formed with five substrate holders 10' and is capable of being removed from the reaction chamber 1 shown in the figure. On both sides of each holder 10' are fixed substrates 10. With the reaction space therebetween, halogen lamp heaters 7 are provided to irradiate the collar 31 and the substrates on the holders 10' with infrared light. The pair of collars 31' are formed and arranged to constitute an enclosure in cooperation with the collar 31, the three collars being made flush with each other. Further, a pair of meshed grids 20 and 20' are provided at the upper side and lower side of the reaction space 1. A glow discharge takes place by applying to the grids 20 and 20' an alternating electric field of 13.56 MHz or a direct electric field by means of power supply 6.

Above the reaction chamber, a resonating space is formed as the inside space of a resonance chamber 2. Non-reactive gas is introduced into the reaction space through conduit line 18. The resonance space is subjected to a magnetic field by energizing core-less coil 5, 5', a Helmholtz coil 5, 5' surrounding the resonating space in this embodiment. A cooling circuit 12, 12' is arranged around the resonance chamber 2. Further, microwaves are radiated into the resonance space from a microwave oscillator 3 via an isolator 4 through a window made of synthetic quartz. Argon gas as a non-reactive gas is introduced and excited in the resonance space. The magnitude of the magnetic field is chosen at 875 Gauss in this case. The magnitude of the magnetic field and the frequency of the microwaves are in general determined according to the molecular weight of the non-reactive gas to be excited.

In this manner, the argon gas thus excited is pinched by the magnetic field and is in a resonance with the microwaves in the presence of a magnetic field. The excited argon gas is introduced to the reaction space 1 through extraction grids 2'. Between the grids 2 and the resonance space are a buffer space 30 and a plurality of nozzles 23 through which reactant gas is introduced throughout the reaction space. The reactant gas is mixed with the excited non-reactant gas and is excited by transferring energy from the non-reactant gas. The mesh electrodes 20 also function as a homogenizer to prevent the excited gas from back-flowing. In the case where the collars are made from an insulator, a pair of insulator grids are used as an homozenizer and a plurality of electrodes are provided to produce electron discharge.

As a result, electrons and the excited gas 21 spread throughout the reaction chamber. Even with the substantial distance between the resonance space and the surfaces of the substrates, the excited energy states of the reactant gas derived from the non-reactive resonance gas remain in the vicinity of the substrates. When cyclotron resonance is used alone as in the prior art, the distance has been chosen to be about 5 to 15 cm. While a short distance between the resonance space and the substrates reduces the loss of energy of the excited gas, it has made the deposited layer uneven.

Further, in order to spread the reaction gas throughout the reaction chamber 1 and establish cyclotron resonance, the pressure in the resonance space and the reaction space is chosen at $1\times10^{-3}$ to $1\times10^{-4}$ torr, $3\times10^{-4}$ for example. The pressure is adjusted by controlling the exhausting rate of vacuum pump 9 by means of control valve 15 in cooperation with a turbo pump 14.

EXPERIMENT 1

This experiment was conducted in order to fabricate an amorphous silicon layer according to the above described system.

Namely, the experiment employed a reaction chamber 40 cm in height and 50 cm in width and length in which is formed a reaction space 30 cm in height and 35 cm in width and length. Ten substrates 10 were placed on the holder 31. Argon gas was introduced as a non-reactive gas into the reaction space 1 under a pressure $3\times10^{-4}$ torr, through the line 18 at a rate of 200 cc/min. Monosilane gas was introduced through the line 16 at a rate of 80 cc/min. In addition to this, $B_2H_6$ gas diluted with $SiH_4$ to a concentration of 0.1 to 10 ppm may be leaked simultaneously to make a substantially intrinsic semiconductor, if desired. An initial high-frequency electric power of 40 W was supplied from the power source 6. Also supplied was microwave energy at a frequency of 2.45 GHz at a power of 200 W to 800 W, preferably 400 W. The magnitude of the magnetic field was chosen at 875±100 Gauss.

The substrates 10 were provided with a transparent conductive layer. A non-monocrystal semiconductor layer, for example, an amorphous silicon semiconductor was deposited thereon at a substrate temperature of 250° C., while exhausting unnecessary gas through the exhaust system 11. The deposition speed was 45 A/sec. This deposition speed is 30 times larger than that obtained with a plasma CVD system alone, i.e. 1.5 A/sec.

A dark conductivity of $4\times10^{-10}$ $Scm^{-1}$ and a photo conductivity of $6\times10^{-5}$ $Scm^{-1}$ (AM: 100 mW/cm$^2$) were obtained as electric characteristics of the deposited amorphous silicon layer which was devoid of dopant. These conductivities are equivalent to those obtained by a plasma CVD deposition system. A high conversion efficiency is expected also in the case where a solar cell is manufactured with a p-i-n junction, the i-layer being fabricated according to the method of this experiment.

EXPERIMENT 2

This experiment was made to demonstrate deposition of a non-monosemiconductor, $Si_xC_{1-x}$ (0<X<1) of p-type. The preparation conditions for this experiment are largely the same as in the previous experiment so that only differences are described in the following.

As a reactant gas, a gas composed of $H_2Si(CH_3)_2/SiH_4=$ 1/7 and a gas composed of $B_2H_6/SiH_4=5/1000$ were introduced into the reaction space 1. The output power of the microwave oscillator 3 was 300 W. The substrate temperature was kept at 180° C. at a pressure of $3\times10_{-4}$ torr. As a result, an optical energy gap of 2.4 eV and a dark conductivity of $3\times10^{-6}$ $Scm^{-1}$ were obtained.

EXPERIMENT 3

This experiment was made to demonstrate deposition of a microcrystalline semiconductor of n-type. Only deviations from Experiment 1 are described for this experiment.

Namely, the reactant gas was introduced as $SiH_4/HW2Q=$ 1/5 to 1/40, preferably 1/30 at a pressure of $3\times10^{-4}$ torr. The output power of the microwave oscillator was 400 W. The substrate temperature was 250° C. As a result, an optical energy gap of 1.65 eV and an electric conductivity of 50 $Scm^{-1}$ were obtained.

Because the ECR system has no sputtering effect even at a high microwave power, the average crystallite size tends to increase thereby rendering the deposited layer more polycrystallized. The crystallization rate is increased to 70% while the rate is only 50% according to a glow discharge plasma CVD system. Further, the semiconductor layer thus formed according to the experiment had a finely textured microcrystallite structure even with the reaction gas of $SiH_4/H_2=1/5$ to 1/40.

EXPERIMENT 4

In this embodiment, a $SiO_{2-x}$ (0<X<2) or $Si_3N_{4-x}$ (0<X<4) layer was deposited in the same basic manner as described in Experiment 1.

Oxygen gas and nitrogen gas were introduced into the resonance space together with argon gas. $SiH_4$ gas was introduced into the reaction chamber 1 through the line 16. The ratio of the introduced oxygen gas or nitrogen gas to the introduced $SiH_4$ determines the value of X. When X=O was desired corresponding to $SiO_2$ or $Si_3N_4$, an equivalent amount of oxygen gas or nitrogen gas to $SiH_4$ was introduced.

Figure 2:
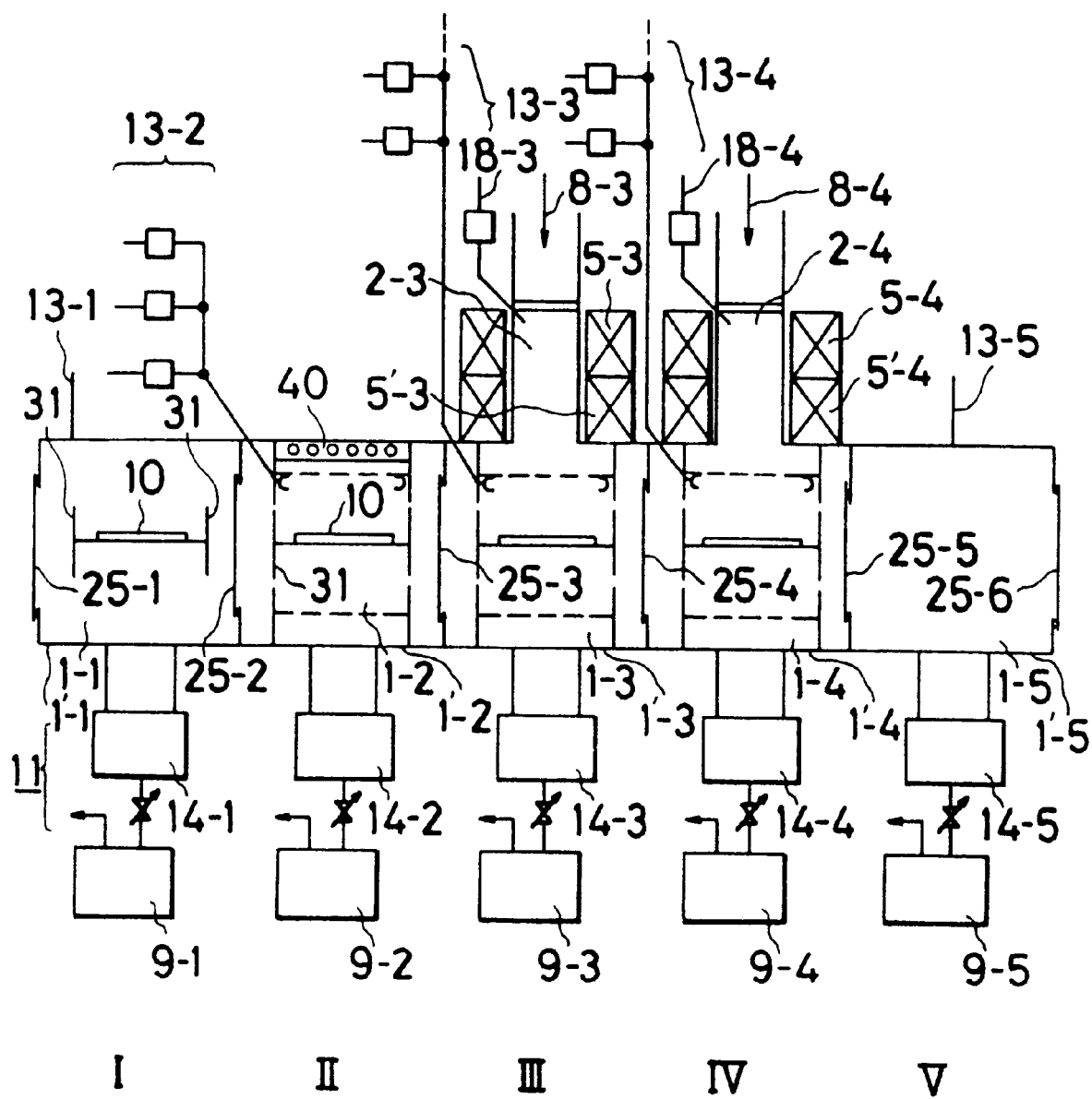
FIG. 2 is a cross-sectional view showing a multi-chamber embodiment of the invention.

Referring now to FIG. 2, another embodiment of the invention is shown. An object of this embodiment is to fabricate a semiconductor layer with a p-i-n junction or an n-i-p junction by means of a multi-chamber system.

The multi-chamber system is comprised of five sections. The first section I is a loading chamber 1'-1. The second section II is a second chamber 1'-2, to deposit, for example, p-type layers. The third section III is a third chamber 1'-3, to deposit, for example, i-type layers. The fourth section IV is a fourth chamber 1'-4 to deposit, for example, n-type layers. The fifth section V is an unloading chamber 1'-5. For producing an n-i-p junction, sections II and IV be interchanged.

Each chamber is provided with a gas feeding system 13-1, 13-2, . . . or 13-5 and an exhausting system 11 equipped with a turbo molecular pump 14-1, 14-2, . . . or 14-5 and a vacuum pump 9-1, 9-2, . . . or 9-5. Each chamber of the intermediate three chambers includes a reaction space 1-2, 1-3 or 1-4, respectively. The second section II is a photo CVD system which is equipped with a mercury lamp 40 and halogen lamps disposed in opposed relations respective to the direction perpendicular to the plane of the drawing with the reaction chamber in between. The third and fourth sections are ECR enhanced CVD systems each of which is configured the same as in FIG. 1 and equipped with a Helmholtz coil 5-3 or 5-4 and a microwave oscillator not shown in the figure. Although argon gas is employed as a resonance gas, hydrogen gas may be used. In the case of hydrogen gas, the magnitude of magnetic field has to be increased inversely proportional to the molecular weight.

A gate valve 25-2, 25-3, . . . or 25-5 is disposed between each pair of adjacent chambers. The substrate holder 31 is transported from one chamber to another with the appropriate gate valve opened. During deposition, of course, the valve is kept closed. The entrance valve 25-1 and the exit valve 25-6 are, however, opened during deposition to furnish a new substrate on the holder in the loading chamber 1'-1 and to remove the substrate which has been deposited on in the chambers 1'-2, 1'-3, and 1'-4.

The deposition processes in the reaction spaces 1-3 and 1-4 are carried out according to Experiment 1, Experiment 2, or Experiment 3. After completion of deposition in the reaction spaces 1-2, 1-3, and 1-4, the supply of the reactant gas and radiation of microwaves are halted and the substrate holders 31 are transported by a transportation means (not shown in the figure) to the adjacent chamber with the valves 25-1 and 25-6 closed. The transporting step is carried out swiftly without exhausting the gas inside of each chamber. The resonance gas, e.g. argon gas, may or may not be continuously introduced. After the transport is completed, the next deposition process is carried out respectively in the chambers 1'-2, 1'-3 and 1'-4 with the valves 25-2 to 25-5 closed. With the above process in mind, it is easily understood that the semiconductor thus deposited is less contaminated and oxidized at the p-i and i-n junctions compared with that formed with a prior art glow discharge plasma CVD system.

The solar cell thus formed has a conversion efficiency of 12.9%, an open circuit voltage of 0.92 V, and a short circuit current density of 18.4 mV/cm$^2$, with an effective area of 1.05 cm$^2$. Such a high conversion efficiency is possibly attributed to the fact that no sputtering by the reactive gas takes place in the ECR CVD system. Further, it can be considered as another reason for the high conversion efficiency that the pressure in the chamber during deposition is $1\times10^{-3}$ to $1\times10^{-5}$ torr, $3\times10^{-4}$ torr for example, which is lower than that employed by a glow discharge plasma system, impurity gas and reactive gas are exhausted by the turbo pump after deposition in a time period reduced by a factor of 100 in comparison with that required in a glow discharge CVD system.

In the embodiment, the gate valves 25-3 and 25-4 may be omitted from the system. In this case, buffer spaces are formed between the chambers to improve the productivity of the system and the adjacent chambers are substantially isolated by means of the side walls of the holder 31.

The solar cell fabricated according to this modification has a conversion efficiency of 12.6%, an open voltage of 0.93V, a short current density of 18.3 mA/cm$_2$, and a fill factor of 0.81, with an effective area of 1.05 cm$^2$. Besides cost saving, it is possible to transport the holder to the adjacent chamber within 5 minutes by dispensing with the gate valves 25-3 and 25-4, thereby increasing the throughput.

Further, according to the embodiment, only one to three pin-holes having 0.1 to 0.01 micron in diameter are observed in a dark field of a microscope with a magnification factor of 100, which is 1/10 of that observed on a layer deposited by a glow discharge method.

The invention is also advantageous when applied to a process for producing an insulated-gate FET of thin film type. In this case, the second section II is a reaction space in which is formed a semiconductor layer. The third section III is a reaction space in which is formed a silicon nitride layer. The fourth section IV is a reaction space in which is formed a silicon oxide layer. Each formation process is substantially the same as described supra.

While a description has been made for several embodiments, the present invention should be limited only by the appended claims and should not be limited by the particular examples. What follow are some examples of modifications and variation according to the invention.

A glow discharge CVD system can be employed as a first section I in the embodiment instead of the photo enhanced CVD system.

Figure 3:
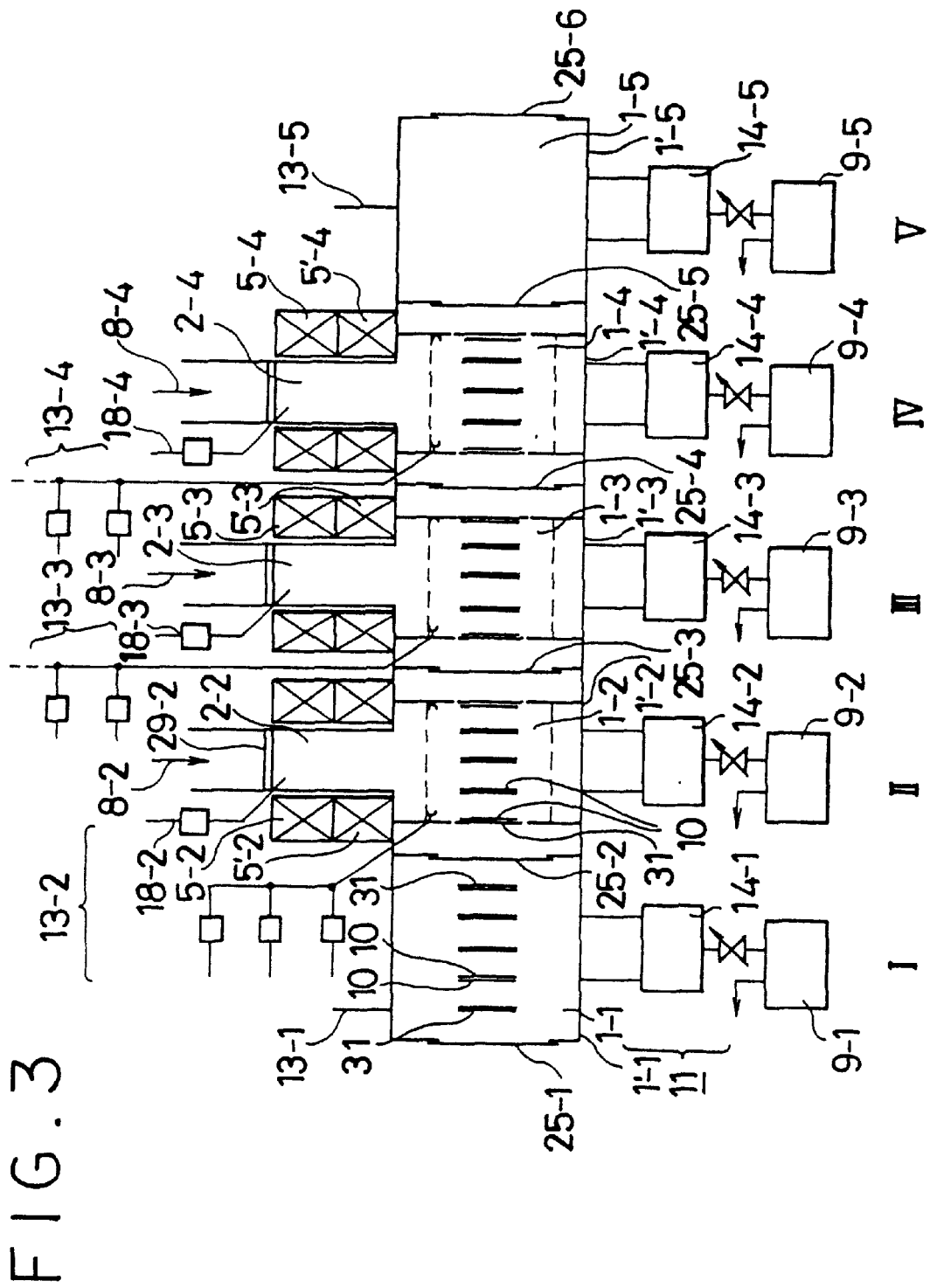
FIG. 3 is a cross-sectional view of another multi-chamber embodiment of the invention.

The multi-chamber embodiment of FIG. 3 illustrates an example of an apparatus for conducting a process according to the present invention. In this embodiment, it will be noted that FIG. 3 shows a structure similar to that shown in FIGS. 1 and 2, with corresponding numerals indicating the same parts in the three figures. The multi-chamber structure of FIG. 3 is similar to that shown in FIG. 2, and wherein each layer of a solar cell with a PIN junction can be deposited by ECR CVD.

Thus, it is seen in the present application with reference to FIG. 3, that the present invention is not limited to the use of a non-microwave-enhanced CVD in combination with a microwave-enhanced CVD. When a solar cell, such as that taught hereinabove with respect to the embodiment of FIG. 2, is fabricated by the apparatus shown in FIG. 2, a first layer is deposited by non-microwave enhanced CVD in the chamber 1-2 and has somewhat poor characteristics in comparison with that fabricated by microwave-enhanced CVD in the following chambers 1-3 and 1-4. By contrast, when fabricated by the apparatus as illustrated in FIG. 3, wherein ECR CVD is used in the chamber 1-2 as well as in the other chambers, a solar cell can be formed with a thoroughly improved PIN junction.

The present invention can be applied to light emitting MISs, superlattice light emitting devices, and so on. Further, the invention is advantageous for semiconductor lasers or integrated circuit optical devices.

Although the ECR system in the embodiment is equipped with a glow discharge system, a photo enhanced system can be incorporated with the ECR system. In this case, an excimer laser having a wavelength of 100 to 400 nm, an argon laser, a nitrogen laser, and so on is used as a light source.

As a reactant gas, disilane or a mixture of monosilane and $Si_2F_6$ may be used which is expected to further improve the deposition speed.

The substrate may be of silicon semiconductor, glass, synthetic resin, stainless steel, or one which is provided with an electrode thereon.

As a semiconductor to be deposited, $Si_xGe_{1-x}$ (0<X<1), $Si_xSn_{1-x}$ (0<X<1), $C_xGe_{1-x}$ (0<X<1), or their intrinsic or impurity semiconductor can be used.

A substrate holder capable of holding a plurality of substrates as shown in FIG. 1 can be used for the multi-chamber system as shown in FIG. 2.

What is claimed is:

1. A CVD apparatus comprising:

a first reaction chamber;

a first substrate holder for supporting a first single substrate in said first reaction chamber;

a first gas introducing means for introducing a first process gas into said first reaction chamber;

a first CVD means for performing a chemical vapor deposition on said first substrate in said first reaction chamber;

a second reaction chamber connected to said first reaction chamber through a gate valve;

a second substrate holder for supporting a second single substrate in said second reaction chamber;

a second gas introducing means for introducing a second process gas into said second reaction chamber;

ECR means including a microwave source and a magnetic field inducing means to excite said second process gas;

an A.C. power source to further energize said second process gas excited by said ECR means, wherein said first and second single substrates are disposed in the first and second reaction chambers so that a flow of the respective process gases is substantially perpendicular to the first and second single substrates and said gate valve is perpendicularly disposed with respect to a major surface of said first and second single substrates as supported in the respective reaction chambers.

2. A CVD apparatus according to 1 wherein said first CVD means includes a light source.

3. A CVD apparatus according to claim 1 wherein said first CVD means includes a pair of electrodes.

4. A CVD apparatus comprising:

a first reaction chamber;

a first substrate holder for supporting a first single substrate in said first reaction chamber;

a first gas introducing means for introducing a first process gas into said first reaction chamber;

a first CVD means for performing a chemical vapor deposition on said first substrate in said first reaction chamber;

a second reaction chamber connected to said first reaction chamber through a gate valve;

a second substrate holder for supporting a second single substrate in said second reaction chamber;

a second gas introducing means for introducing a second process gas into said second reaction chamber;

a second CVD means for performing a chemical vapor deposition on said second substrate in said second reaction chamber, wherein said first and second single substrates are disposed in the first and second reaction chambers so that a flow of the respective process gases is substantially perpendicular to the first and second single substrates and said gate valve is perpendicularly disposed with respect to a major surface of said first and second single substrates as supported in the respective reaction chambers.

5. A multi-chamber system comprising:

a first ECR CVD apparatus including at least a first resonance chamber for producing a plasma by electron cyclotron resonance and a first reaction chamber connected to said first resonance chamber for performing a first CVD on a substrate in said first reaction chamber; and a second ECR CVD apparatus including at least a second resonance chamber for producing a plasma by electron cyclotron resonance and a second reaction chamber connected to said second resonance chamber for performing a second CVD therein on a substrate in said second reaction chamber, wherein each of said first and second ECR CVD apparatuses is provided with a microwave introducing means for introducing microwaves into the respective resonance chamber, a magnetic field inducing means for inducing a magnetic field in the respective resonance chamber to cause said electron cyclotron resonance, and wherein each of said first and second reaction chambers is provided with an electrode connected to an A.C. or D.C. power source.

* * * * *